(12) United States Patent
Nomaru

(10) Patent No.: US 7,428,062 B2
(45) Date of Patent: Sep. 23, 2008

(54) MEASURING APPARATUS FOR WORK HELD BY CHUCK TABLE, AND LASER BEAM MACHINING APPARATUS

(75) Inventor: Keiji Nomaru, Ota-ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/006,530

(22) Filed: Jan. 3, 2008

(65) Prior Publication Data

US 2008/0170243 A1    Jul. 17, 2008

(30) Foreign Application Priority Data

Jan. 15, 2007    (JP)    ............................. 2007-005709

(51) Int. Cl.
*G01B 11/24* (2006.01)
*G03B 21/14* (2006.01)
*G02B 21/00* (2006.01)

(52) U.S. Cl. ...................... 356/614; 356/609; 356/624; 250/201.3; 359/368; 353/31

(58) Field of Classification Search ......... 356/601–625; 250/203.1, 208.1; 359/368, 389, 376; 353/31, 353/38

See application file for complete search history.

(56) References Cited

U.S. PATENT DOCUMENTS

| | | | | |
|---|---|---|---|---|
| 4,871,257 A | * | 10/1989 | Suzuki et al. | ............... 356/400 |
| 4,932,781 A | * | 6/1990 | Kuwayama | ................. 356/505 |
| 5,105,076 A | * | 4/1992 | Premji | ...................... 250/201.5 |
| 5,737,084 A | * | 4/1998 | Ishihara | ...................... 356/609 |
| 6,031,661 A | * | 2/2000 | Tanaami | ..................... 359/368 |
| 6,332,684 B1 | * | 12/2001 | Shibatani et al. | ............. 353/31 |
| 6,429,943 B1 | * | 8/2002 | Opsal et al. | ................. 356/625 |
| 6,838,650 B1 | * | 1/2005 | Toh | ......................... 250/201.3 |
| 6,842,259 B2 | * | 1/2005 | Rosencwaig et al. | ......... 356/601 |
| 6,940,610 B2 | * | 9/2005 | Prinzhausen et al. | ......... 356/609 |
| 7,394,552 B2 | * | 7/2008 | Spink | .......................... 356/603 |

FOREIGN PATENT DOCUMENTS

JP    A 10-305420    11/1998
JP    B2 3408805    3/2003

* cited by examiner

*Primary Examiner*—Sang Nguyen
(74) *Attorney, Agent, or Firm*—Greer, Burns & Crain, Ltd.

(57) ABSTRACT

An apparatus for measuring the height of a work held by a chuck table provided in a machining apparatus, including: a white light source for emitting a white beam of light; a chromatic aberration lens for condensing the white beam emitted from the white light source; a beam splitter which is disposed between the white light source and the chromatic aberration lens and by which a reflected beam of the white beam irradiating the work therewith is split; a first condenser lens for condensing the reflected beam split by the beam splitter; a diffraction grating by which the reflected beam condensed by the first condenser lens is converted into a diffracted beam; a second condenser lens for condensing the diffracted beam diffracted by the diffraction grating; and a wavelength detecting unit for detecting the wavelength of the diffracted beam condensed by the second condenser lens.

3 Claims, 10 Drawing Sheets

MEASURING APPARATUS FOR WORK HELD BY CHUCK TABLE, AND LASER BEAM MACHINING APPARATUS

BACKGROUND OF THE INVENTION

1. Field of the Invention

The present invention relates to an apparatus for measuring the upper surface height and/or thickness of a work, such as a semiconductor wafer, held by a chuck table provided in a machining apparatus such as a laser beam machining apparatus, and to a laser beam machining apparatus equipped with the measuring apparatus.

2. Description of the Related Art

In a semiconductor device manufacturing process, a plurality of regions are demarcated in a surface of a substantially circular disk-like semiconductor wafer by planned dividing lines called streets which are arranged in a lattice pattern, and devices such as ICs and LSIs are formed in the demarcated regions. Then, the semiconductor wafer is cut (diced) along the streets to divide the regions with the devices formed therein, whereby individual semiconductor chips are manufactured. As a method for dividing the wafer such as a semiconductor wafer and an optical device wafer along the streets, there has been attempted a laser beam machining method in which a pulsed laser beam capable of being transmitted through the wafer is used, and the wafer is irradiated with the laser beam, which is converged to a point in the inside of the regions to be divided. In the dividing method based on the laser beam machining method, specifically, a laser beam having a wavelength of, for example, 1064 nm which can be transmitted through the wafer is used to irradiate the wafer therewith from one side of the wafer while setting the converging point of the laser beam in the inside of the wafer, to continuously form a denatured layer inside the wafer along the streets, and an external force is exerted along the planned dividing lines where the wafer is lowered in strength due to the denatured layer formed there, whereby the work is divided (refer to, for example, Japanese Patent No. 3408805).

In addition, as a method for dividing a plate-shaped work such as a semiconductor wafer, there has been proposed a method in which irradiation with a pulsed laser beam is conducted along the streets in the wafer so as to form laser beam-machined grooves, and the wafer is cut (diced) along the laser beam-machined grooves by a mechanical breaking apparatus (refer to, for example, Japanese Patent Laid-open No. Hei 10-305420). In the case of thus forming the laser beam-machined grooves along the streets formed in the work, also, it is important to position the converging point of the laser beam at a predetermined height with respect to the work.

Besides, as a machining method by which a hole (via hole) reaching an electrode called a bonding pad is formed in a surface of a semiconductor wafer at the position of the bonding pad from the back side of the wafer, there has been attempted a method in which the semiconductor wafer is irradiated with a pulsed laser beam from the back side thereof. However, when the semiconductor wafer has a dispersion of thickness, it may be impossible to accurately form the hole (via hole) reaching the bonding pad. Therefore, it may be necessary to accurately grasp the thickness in the bonding pad area of the semiconductor wafer.

However, a plate-shaped work such as a semiconductor wafer often has undulation and has a dispersion of the thickness thereof, so that it is difficult to achieve uniform laser beam machining of such a work. More specifically, in the case of forming a denatured layer in the wafer along the streets, the presence of a dispersion of wafer thickness would make it very difficult to uniformly form the denatured layer at a predetermined depth position, due to the relationship thereof with the refractive index, in irradiating the wafer with the laser beam. Also, in the case of forming the laser beam-machined grooves along the streets formed in a wafer, the presence of a dispersion of wafer thickness would make it very difficult to form the laser beam-machined grooves with a uniform depth. Furthermore, in the case of forming a hole (via hole) reaching a bonding pad in a wafer, the presence of a dispersion of wafer thickness would make it very difficult to accurately form the hole (via hole) reaching the bonding pad.

SUMMARY OF THE INVENTION

Accordingly, an object of the present invention is to provide a measuring apparatus by which the upper surface height and/or thickness of a work, such as a semiconductor wafer, held by a chuck table can be measured assuredly, and a laser beam machining apparatus equipped with the measuring apparatus.

In accordance with an aspect of the present invention, there is provided an apparatus for measuring the height of a work held by a chuck table provided in a machining apparatus, including: a white light source for emitting a white beam of light; a chromatic aberration lens for condensing the white beam emitted from the white light source so as to irradiate the work held by the chuck table with the condensed white beam; a beam splitter which is disposed between the white light source and the chromatic aberration lens and by which the reflected beam of the white beam irradiating the work therewith is split; a first condenser leans for condensing the reflected beam which is again reflected by the beam splitter; a mask provided with a pinhole which is disposed at a converging point position of the first condenser lens and through which the reflected beam condensed by the first condenser lens passes; a second condenser lens for condensing the reflected beam having passed through the pinhole in said mask; a diffraction grating by which the reflected beam condensed by the second condenser lens is converted into a diffracted beam; a third condenser lens for condensing the diffracted beam diffracted by the diffraction grating; wavelength detecting means for detecting the wavelength of the diffracted beam condensed by the third condenser lens; and control means for determining the height position of the work held by the chuck table, based on a wavelength signal from the wavelength detecting means; wherein the control means has a memory for storing a control map setting the relationship between wavelengths and focal distances for the white beam condensed by the chromatic aberration lens, and collates the wavelength signal from the wavelength detecting means with the control map so as to determine the focal distance from the chromatic aberration lens, thereby measuring the height position of the work held by the chuck table.

Preferably, the measuring apparatus for a work further includes: X-axis moving means for relatively moving the chromatic aberration lens and the chuck table in an X-axis direction; Y-axis moving means for relatively moving the chromatic aberration lens and the chuck table in a Y-axis direction orthogonal to the X-axis direction; X-axis direction position detecting means for the chuck table; and Y-axis direction position detecting means for said chuck table; wherein the control means determines the height position, at a predetermined position, of the work, based on detection signals from the wavelength detecting means as well as the X-axis direction position detecting means and the Y-axis direction position detecting means, and has a memory for storing the height position, at the predetermined position, of the work.

In accordance with another aspect of the present invention, there is provided a laser beam machining apparatus including a chuck table having a holding surface for holding a work thereon, machining laser beam irradiation means for irradiating the work held by the chuck table with a machining laser beam, and converging point position adjusting means for moving the machining laser beam irradiation means in a direction orthogonal to the holding surface of said chuck table, wherein the above-mentioned measuring apparatus is provided, and the measuring apparatus measures the height position of the work held by the chuck table.

According to the present invention, by utilizing the fact that the white beam having passed through the chromatic aberration lens has different focal distances depending on wavelength, the wavelength is specified based on the reflected beam of the white beam, whereby the focal distance is determined. Therefore, the height position of the work held by the chuck table can be measured accurately.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
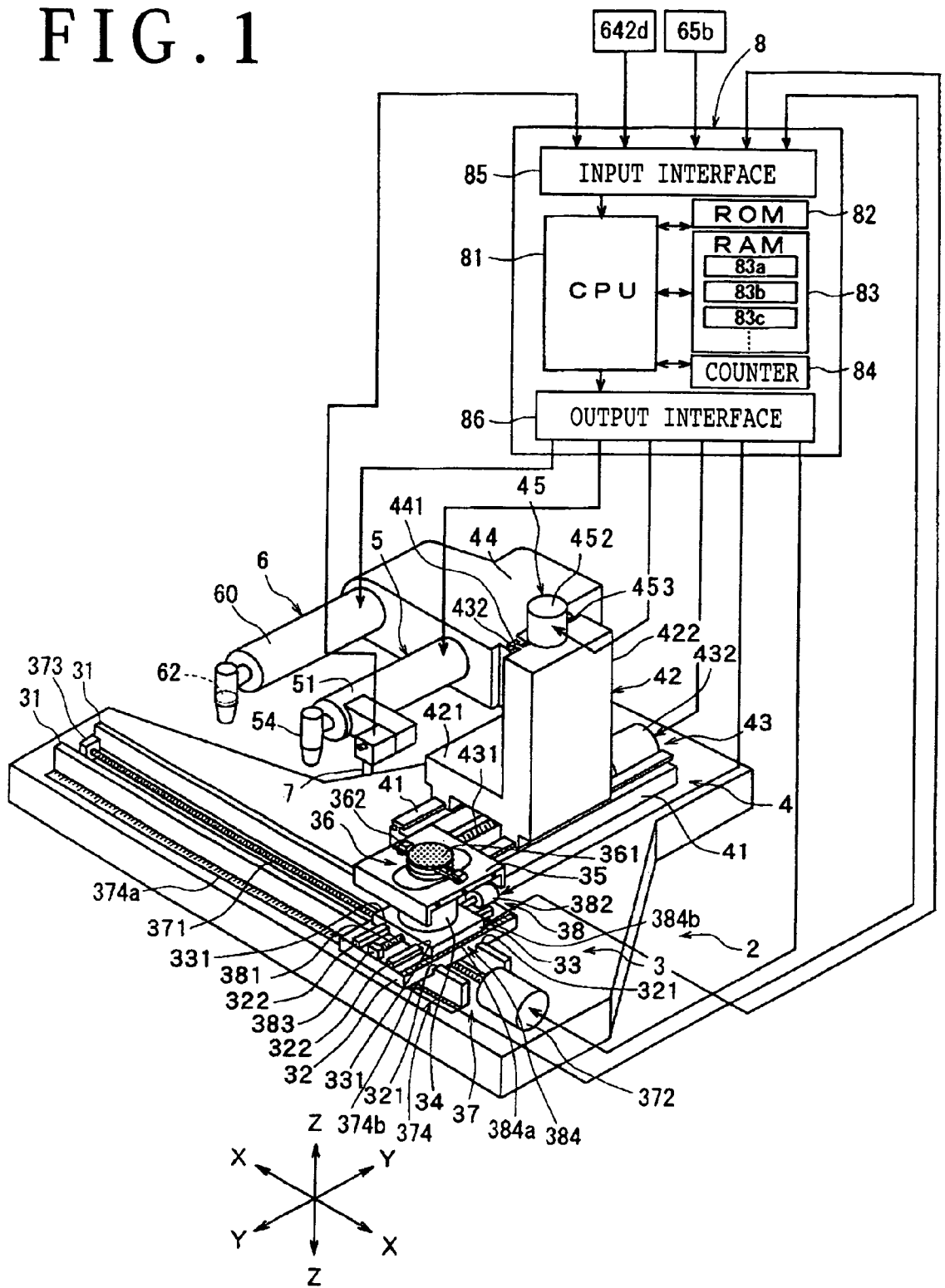
FIG. 1 is a perspective view of a laser beam machining apparatus configured according to the present invention.

Now, preferred embodiments of a measuring apparatus and a laser beam machining apparatus for a work held by a chuck table, which apparatuses are configured according to the present invention, will be described in detail below referring to the attached drawings. FIG. 1 shows a perspective view of a laser beam machining apparatus equipped with a measuring apparatus for measuring the height of a work held by a chuck table, configured according to the present invention. The laser beam machining apparatus shown in FIG. 1 includes: a stationary base 2; a chuck table mechanism 3 which is disposed on the stationary base 2 so as to be movable in a machining feed direction indicated by arrow X (X-axis direction) and by which a work is held; a laser beam irradiation unit support mechanism 4 disposed on the stationary base 2 so as to be movable in an indexing feed direction indicated by arrow Y (Y-axis direction) perpendicular to the machining feed direction indicated by arrow X (X-axis direction); a machining laser beam irradiation unit 5 disposed on the laser beam unit support mechanism 4 so as to be movable in a direction indicated by arrow Z (Z-axis direction); and a measuring beam irradiation unit 6 constituting a measuring apparatus for measuring the height of the work held by the chuck table. The machining laser beam irradiation unit 5 and the measuring beam irradiation unit 6 are mounted to a common unit holder 44.

The chuck table mechanism 3 includes: a pair of guide rails 31, 31 disposed on the stationary base 2 in parallel to each other along the machining feed direction indicated by arrow X (X-axis direction); a first sliding block 32 disposed on the guide rails 31, 31 so as to be movable in the machining feed direction indicated by arrow X (X-axis direction); a second sliding block 33 disposed on the first sliding block 32 so as to be movable in the indexing feed direction indicated by arrow Y (Y-axis direction); a cover table 35 supported on the second sliding block 33 by a hollow cylindrical member 34; and the chuck table 36 provided as work holding means. The chuck table 36 is provided with a suction chuck 361 formed from a porous material, and a semiconductor wafer as the work is held on (a holding surface of) the suction chuck 361 by suction means (not shown). The chuck table 36 thus configured is rotated by a pulse motor (not shown) which is disposed inside the hollow cylindrical member 34. Incidentally, the chuck table 36 is equipped with clamps 362 for fixing an annular frame which will be described later.

The first sliding block 32 is provided in its lower surface with a pair of guided grooves 321, 321 for engagement with the pair of guide rails 31, 31, and is provided on its upper surface with a pair of guide rails 322, 322 formed in parallel to each other along the indexing feed direction indicated by arrow Y (Y-axis direction). The first sliding block 32 thus configured is movable in the machining feed direction indicated by arrow X (X-axis direction) along the pair of guide rails 31, 31, with its guided grooves 321, 321 in engagement with the pair of guide rails 31, 31. The chuck table mechanism 3 in the embodiment shown in the figure has machining feeding means 37 (X-axis moving means) for moving the first sliding block 32 in the machining feed direction indicated by arrow X (X-axis direction) along the pair of guide rails 31, 31. The machining feeding means 37 includes a male screw rod 371 disposed between and in parallel to the pair of guide rails 31 and 31, and a drive source such as a pulse motor 372 for rotationally driving the male screw rod 371. The male screw rod 371 is rotatably supported at its one end on a bearing block 373 fixed to the stationary base 2, and is power-transmittingly connected at its other end to an output shaft of the pulse motor 372. Incidentally, the male screw rod 371 is in screw engagement with a penetrating female screw hole formed in a female screw block (not shown) projectingly provided on a lower surface of a central part of the first sliding block 32. Therefore, with the male screw rod 371 driven by the pulse motor 372 to rotate normally and reversely, the first sliding block 32 is moved in the machining feed direction indicated by arrow X (X-axis direction) along the guide rails 31, 31.

The laser beam machining apparatus in the embodiment shown in the figure has machining feed amount detecting means 374 for detecting the machining feed amount of the chuck table 36. The machining feed amount detecting means 374 is composed of a linear scale 374a disposed along the guide rail 31, and a reading head 374b which is disposed on the first sliding block 32 and which is moved along the linear scale 374a together with the sliding block 32. The reading head 374b of the feed amount detecting means 374, in the embodiment shown in the figure, sends to control means (described later) a pulse signal containing one pulse per 1-µm feed. Then, the control means (described later) counts the pulses in the pulse signal to thereby detect the machining feed amount of the chuck table 36. Therefore, the machining feed amount detecting means 374 functions as X-axis direction position detecting means for detecting the position in the X-axis direction of the chuck table 36. Incidentally, in the case where the pulse motor 372 is used as the drive source in the machining feeding means 37, the machining feed amount of the chuck table 36 can be detected also by counting the driving pulses in the control means (described later) which outputs a driving signal to the pulse motor 372. Besides, in the case where a servo motor is used as the drive source in the machining feeding means 37, the machining feed amount of the chuck table 36 can also be detected by a method in which a pulse signal outputted from a rotary encoder for detecting the rotating speed of the servo motor is sent to the control means (described later), and the control means counts the pulses in the pulse signal inputted thereto.

The second sliding block 33 is provided in its lower surface with a pair of guided grooves 331, 331 for engagement with the pair of guide rails 322, 322 provided on the upper surface of the first sliding block 32, and is movable in the indexing feed direction indicated by arrow Y (Y-axis direction), with its guided grooves 331, 331 in engagement with the pair of guide rails 322, 322. The chuck table mechanism 3 in the embodiment shown in the figure has first indexing feeding means 38 (Y-axis moving means) for moving the second sliding block 33 in the indexing feed direction indicated by arrow Y (Y-axis direction) along the pair of guide rails 322, 322 provided on the first sliding block 32. The first indexing feeding means 38 includes a male screw rod 381 disposed between and in parallel to the pair of guide rails 322 and 322, and a drive source such as a pulse motor 382 for rotationally driving the male screw rod 381. The male screw rod 381 is rotatably supported at its one end on a bearing block 383 fixed on an upper surface of the first sliding block 32, and is power-transmittingly connected at its other end to an output shaft of the pulse motor 382. Incidentally, the male screw rod 381 is in screw engagement with a penetrating female screw hold formed in a female screw block (not shown) projectingly provided on a lower surface of a central part of the second sliding block 33. Therefore, with the male screw rod 381 driven by the pulse motor 382 to rotate normally and reversely, the second sliding block 33 is moved in the indexing feed direction indicated by arrow Y (Y-axis direction) along the guide rails 322, 322.

The laser beam machining apparatus in the embodiment shown in the figure has indexing feed amount detecting means 384 for detecting the indexing feed amount of the second sliding block 33. The indexing feed amount detecting means 384 is composed of a linear scale 384a disposed along the guide rail 322, and a reading head 384b which is disposed on the second sliding block 33 and which is moved along the linear scale 384a together with the sliding block 33. The reading head 384b of the feed amount detecting means 384, in the embodiment shown in the figure, sends to the control means (described later) a pulse signal containing one pulse per 1-µm feed. Then, the control means (described later) counts the pulses in the pulse signal inputted thereto, so as to detect the indexing feed amount of the chuck table 36. Therefore, the indexing feed amount detecting means 384 functions as Y-axis direction position detecting means for detecting the position in the Y-axis direction of the chuck table 36. Incidentally, in the case where the pulse motor 38 is used as the drive source in the first indexing feeding means 38, the indexing feed amount of the chuck table 36 can be detected also by counting the driving pulses in the control means (described later) which outputs a driving signal to the pulse motor 382. Besides, in the case where a servo motor is used as the drive source in the first indexing feeding means 38, the indexing feed amount of the chuck table 36 can also be detected by a method in which a pulse signal outputted from a rotary encoder for detecting the rotating speed of the servo motor is sent to the control means (described later), and the control means counts the pulses in the pulse signal inputted thereto.

The laser beam irradiation unit support mechanism 4 has a pair of guide rails 41, 41 disposed on the stationary base 2 in parallel to each other along the indexing feed direction indicated by arrow Y (Y-axis direction), and a movable support base disposed on the guide rails 41, 41 so as to be movable in the direction indicated by arrow Y. The movable support base 42 is composed of a moving support part 421 disposed on the guide rails 41, 41 so as to be movable, and an attachment part 422 attached to the moving support part 421. The attachment part 422 is provided on its side surface with a pair of parallel guide rails 423, 423 extending in the direction indicated by arrow Z (Z-axis direction). The laser beam irradiation unit support mechanism 4 in the embodiment shown in the figure has a second indexing feeding means (Y-axis moving means) for moving the movable support base 42 in the indexing feed direction indicated by arrow Y (Y-axis direction) along the pair of guide rails 41, 41. The second indexing feeding means 43 includes a male screw rod 43 disposed between and in parallel to the pair of guide rains 41 and 41, and a drive source such as a pulse motor 432 for rotationally driving the male screw rod 431. The male screw rod 431 is rotatably supported at its one end on a bearing block (not shown) fixed to the stationary base 2, and is power-transmittingly connected at its other end to an output shaft of the pulse motor 432. Incidentally, the male screw rod 431 is in screw engagement with a female screw hole formed in a female screw block (not shown) projectingly provided on a lower surface of a central part of the moving support part 421. Therefore, with the male screw rod 431 driven by the pulse motor 432 to rotate normally and reversely, the movable support base 42 is moved in the indexing feed direction indicated by arrow Y (Y-axis direction) along the guide rails 41, 41.

The common unit holder 44 to which the machining laser beam irradiation unit 5 and the measuring beam irradiation unit 6 are mounted is provided with a pair of guided grooves 441, 441 for slidable engagement with the pair of guide rails 423, 423 provided on the attachment part 422 of the movable support base 42, and is supported to be movable in the direction indicated by arrow Z (Z-axis direction), with its guided grooves 441, 441 in engagement with the guide rails 423, 423.

The laser beam machining apparatus in the embodiment shown in the figure has converging (condensing) point position adjusting means 45 for moving the unit holder 44 in the direction indicated by arrow Z (Z-axis direction), i.e., in the direction perpendicular to the holding surface of the chuck table 36, along the pair of guide rails 423, 423. The converging point position adjusting means 45 includes a male screw rod (not shown) disposed between the pair of guide rails 423, 423, and a drive source such as a pulse motor 452 for rotationally driving the male screw rod, and is so configured that, with the male screw rod (not shown) driven by the pulse motor 452 to rotate normally and reversely, the unit holder 44 with the machining laser beam irradiation unit 5 and the measuring beam irradiation unit 6 mounted thereto is moved in the direction indicated by arrow Z (Z-axis direction) along the guide rails 423, 423. Incidentally, in the embodiment shown in the figure, when the pulse motor 452 is driven to rotate normally, the machining laser beam irradiation unit 5 and the measuring beam irradiation unit 6 are moved upwards, and, when the pulse motor 452 is driven to rotate reversely, the machining laser beam irradiation unit 5 and the measuring beam irradiation unit 6 are moved downwards.

Figure 2:
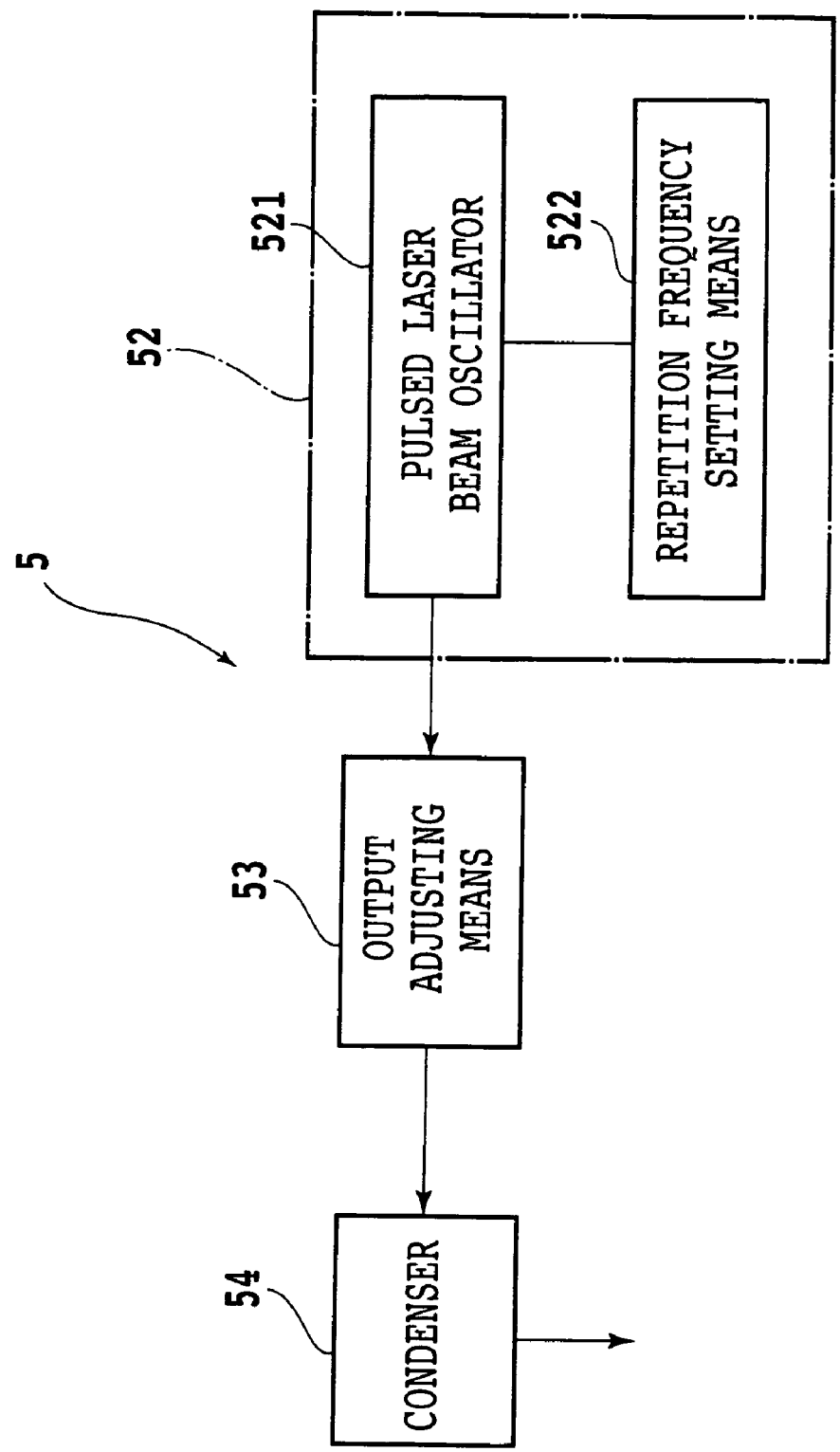
FIG. 2 is a block diagram of a machining laser beam irradiation unit provided in the laser beam machining apparatus shown in FIG. 1.

The machining laser beam irradiation unit 5 in the embodiment shown in the figure includes a hollow cylindrical casing 51 which is fixed to the unit holder 44 and which extends substantially horizontally. In addition, the machining laser beam irradiation unit 5, as shown in FIG. 2, has pulsed laser beam oscillating means 52 and output adjusting means 53 which are disposed inside the casing 51, and a condenser 54 mounted to the tip of the casing 51. The pulsed laser beam oscillating means 52 includes a pulsed laser beam oscillator 521 composed of a YAG laser oscillator or a YVO4 laser oscillator, and a repetition frequency setting means 522 annexed thereto.

Image pickup means 7 is disposed at a front end part of the casing 51 constituting the machining laser beam irradiation unit 5. The image pickup means 7 includes not only an ordinary image pickup device (CCD) for imaging by use of a visible beam but also infrared illumination means for irradiating the work with infrared rays, an optical system for catching the infrared rays radiated from the infrared illumination means, an image pickup device (infrared CCD) for outputting an electrical signal corresponding to the infrared rays caught by the optical system, and the like, and sends picture signals corresponding to the picked-up images to the control means (described later).

Figure 3:
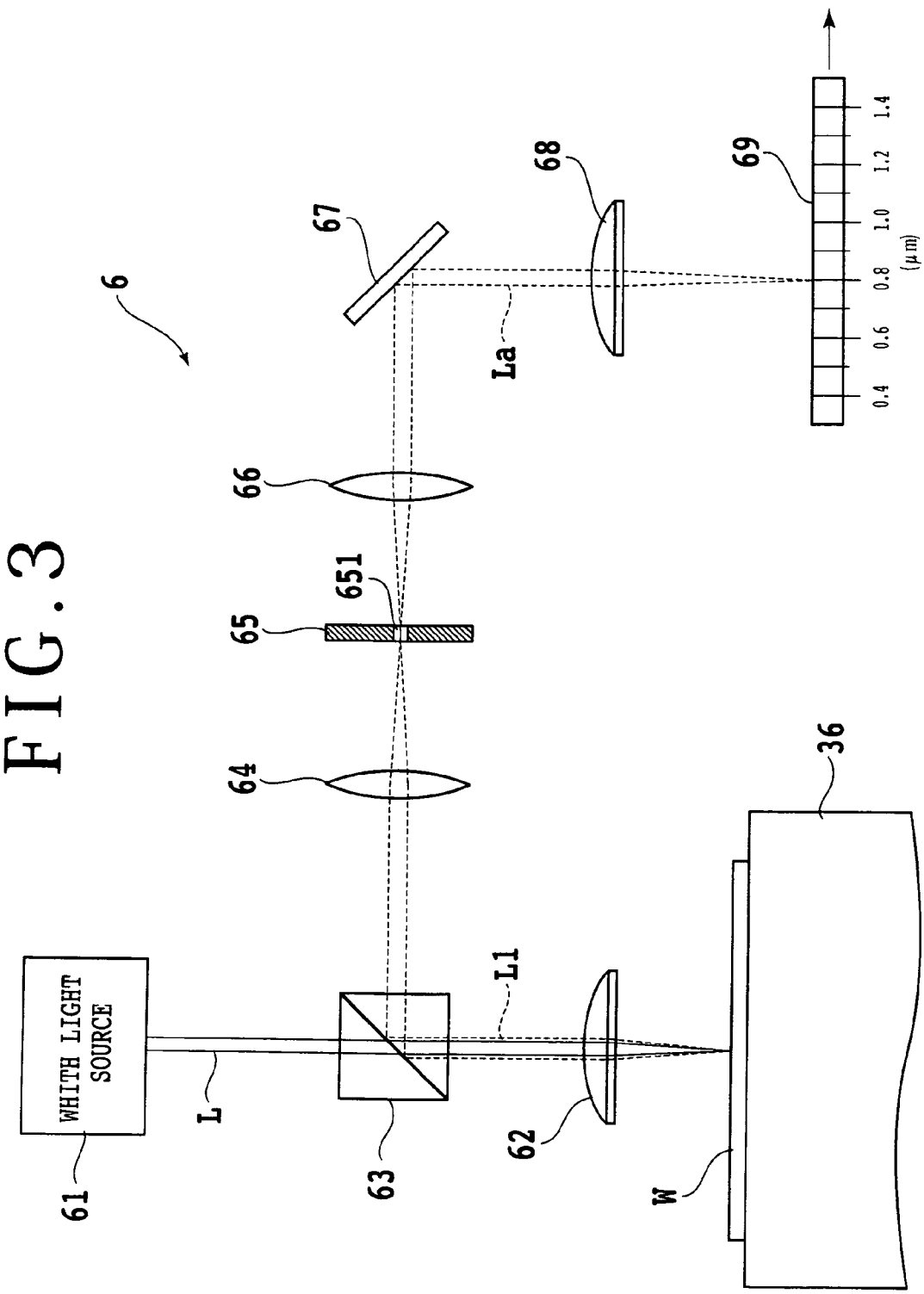
FIG. 3 is a block diagram of a measuring beam irradiation unit provided in the laser beam machining apparatus shown in FIG. 1.

Now, the measuring beam irradiation unit 6 constituting the measuring apparatus for measuring the height of the work held by the chuck table will be described below, referring to FIGS. 1 and 3.

The measuring beam irradiation unit 6 in the embodiment shown in the figures includes a hollow cylindrical casing 60 which is fixed to the unit holder 44 and which extends substantially horizontally. Besides, as shown in FIG. 3, the measuring beam irradiation unit 6 has a white light source 61 disposed inside the casing 60 and operative to emit a white beam, a chromatic aberration lens 62 for condensing the white beam emitted from the white light source 61 so as to irradiate the work W held by the chuck table 36 with the condensed white beam, and a beam splitter 63 which is disposed between the white light source 61 and the chromatic aberration lens 62 and by which the beam reflected from the work W irradiated with the white beam is split. As the white light source, there may be used a white light, a light emitting diode (LED) or the like. The chromatic aberration lens 61 is composed of a lens having chromatic aberration such as a gradium lens, in which the refractive index differs depending on the wavelength of light. Therefore, the white beam incident on the chromatic aberration lens 62 is condensed in such a manner that the beam components with different wavelength have different focal distances (converging positions). The beam splitter 63 transmits the white beam emitted from the white light source 61 toward the chromatic aberration lens 62 as indicated by solid lines, and, simultaneously, reflects at an angle of 90 degrees the beam reflected from the work W as indicated by broken lines.

The beam reflected by the beam splitter 63 reaches wavelength detecting means 69 through a first condenser lens 64, a mask 65, a second condenser lens 66, a diffraction grating 67, and a third condenser lens 68. The first condenser lens 64 is composed of a lens having no chromatic aberration, such as an achromatic lens, and condenses the beam reflected by the beam splitter 63. The mask 65 has a pinhole 651 which is disposed at the converging point position of the first condenser lens 64 and through which the reflected beam condensed by the first condenser lens 64 travels. Incidentally, the pinhole 651 may have a diameter of 10 to 100 μm. The second condenser lens 66 is composed of a lens having no chromatic aberration, such as an achromatic lens, and condenses the reflected light having passed through the pinhole 651. The diffraction grating 67 converts the reflected beam condensed by the second condenser lens 66 into a diffracted beam. The third condenser lens condenses the diffracted beam converted from the reflected light by the diffraction grating 67, and irradiates the wavelength detecting means 69 with the thus condensed diffracted beam. The wavelength detecting means 69 is composed of a CCD, a CMOS, a PSD or the like, detects the wavelength of the diffracted beam condensed by the third condenser 68, and sends a wavelength signal indicative of the detected wavelength to the control means (described later).

Operations of the measuring beam irradiation unit 6 as above will be described below. The white beam L emitted from the white light source 61 is transmitted through the beam splitter 63 to be incident on the chromatic aberration lens 62 as indicated by solid lines in FIG. 3, and is condensed by the chromatic aberration lens 62, before irradiating therewith the work W held by the chuck table 36. In this case, since the white beam L condensed by the chromatic aberration lens 62 shows differences in refractive index depending on wavelength, the beam components with different wavelengths are focused with different focal distances. Therefore, when the white beam L with which the work W is irradiated is reflected by the upper surface of the work W, the beam component with such a wavelength as to have a condensing point just on the upper surface of the work W is reflected with a smallest diameter. The reflected beam L1 of which the wavelength S1 is such as to have the condensing point on the upper surface of the work W and which is reflected by the upper surface of the work W is reflected by the beam splitter 63 to be incident on the first condenser lens 64, as indicated by broken lines. The reflected beam L1 incident on the first condenser lens 64 is condensed, to pass through the pinhole 651 of the mask 65, and is again condensed by the second condenser lens 66, to reach the diffraction grating 67.

Incidentally, the reflected beam components with such wavelengths as not to have converging points just on the upper surface of the work W are reflected with large diameters; therefore, even though condensed by the first condenser lens 64, these reflected beam components are mostly blocked by the mask 65, and their portions passing through the pinhole 651 are very small in quantity. The reflected beam reaching the diffraction grating 67 is converted into a diffracted beam corresponding to the wavelength thereof, and is reflected at an angle corresponding to the wavelength thereof, before reaching the third condenser lens 68. The diffracted beam La arriving at the third condenser lens 68 is condensed, to be incident on the wavelength detecting means 69. The wavelength detecting means 69 detects the wavelength S1 of the reflected beam L1, based on the irradiation position of the diffracted beam La, and sends a wavelength signal indicative of the detected wavelength to the control means (described later). Incidentally, of the reflected beam components of which the wavelengths are such as not to have the converging points just on the upper surface of the work W and which are mostly blocked by the mask 65, the portions passing through the pinhole 651 are also reflected by the diffraction grating 67 at respective predetermined angles, to pass through the third condenser lens 68 and reach the wavelength detecting means 69; however, these portions are too small in quantity to actuate the wavelength detecting means 69. Based on the wavelength signal inputted to the control means (described later), the control means determines the focal distance corresponding to this wavelength of the chromatic aberration lens 62, to thereby determine the height position of the upper surface of the work W.

Figure 4:
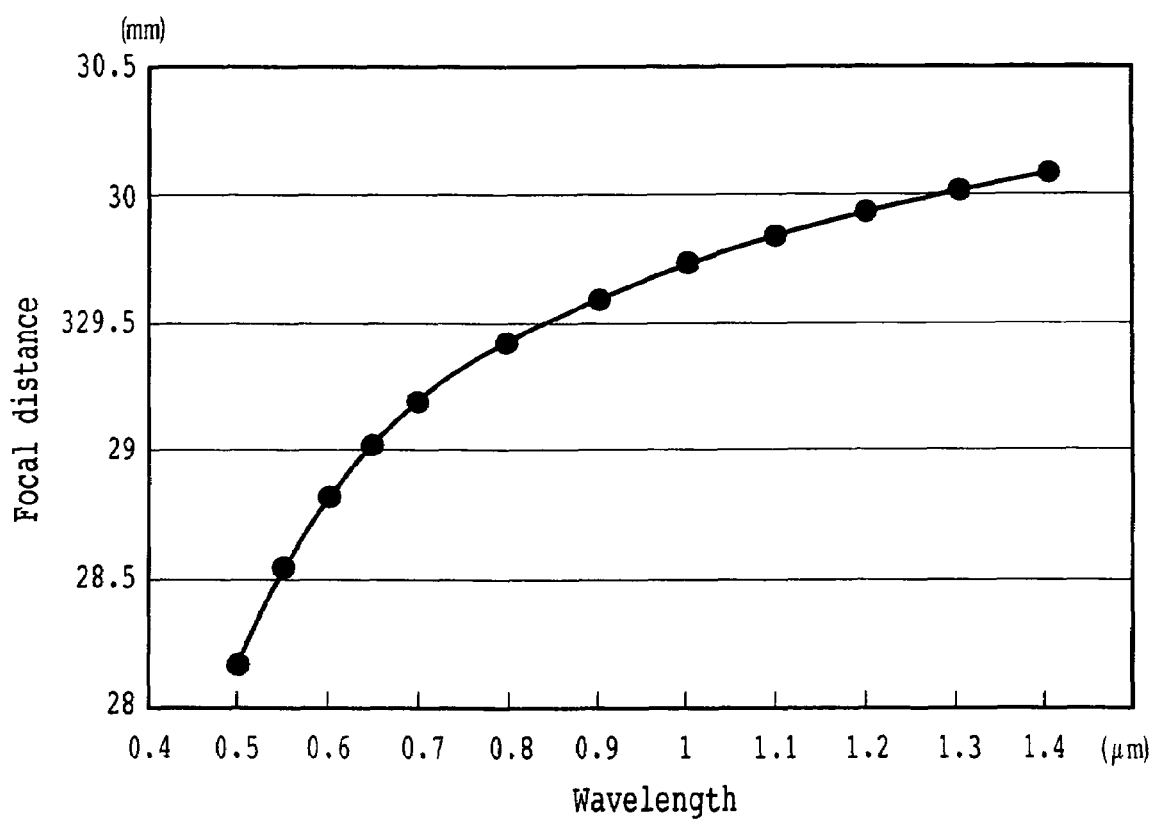
FIG. 4 shows a control map setting the relationship between wavelength and focal distance, for a white beam condensed by a chromatic aberration lens, the control map being stored in a memory in control means provided in the laser beam machining apparatus shown in FIG. 1.

The control means (described later) is provided with a control map setting the relationship between wavelength and focal distance, for the white beam condensed by the chromatic aberration lens 62, as shown in FIG. 4, and determines the focal distance corresponding to the wavelength signal sent from the wavelength detecting means 69, by referring to the control map. Accordingly, the position corresponding to the focal distance from the chromatic aberration lens 62 is the height position of the upper surface of the work W held by the chuck table 36. For example, in the case where the wavelength signal sent from the wavelength detecting means 69 indicates a wavelength of 0.8 μm, in the control map shown in FIG. 4, the focal distance from the chromatic aberration lens 62 is 29.4 mm and, therefore, the height position of the upper surface of the work W held by the chuck table 36 is 29.4 mm below the chromatic aberration lens 62.

Returning to FIG. 1 to continue description, the laser beam machining apparatus in the embodiment shown in the figure has the control means 8. The control means 8 is composed of a computer, which includes a central processing unit (CPU) 81 for performing arithmetic operations according to a control program, a read only memory (ROM) 82 for storing the control program and the like, a random access memory (RAM) 83 for storing the arithmetic operation results and the like, a counter 84, an input interface 85 and an output interface 86. Detection signals from the machining feed amount detecting means 374, the indexing feed amount detecting means 384, the wavelength detecting means 69, the image pickup means 7 and the like are inputted to the input interface 85 of the control means 8. Control signals are outputted from the output interface 86 of the control means 8 to the pulse motor 372, the pulse motor 382, the pulse motor 432, the pulse motor 532, the machining pulsed laser beam oscillating means 5, the measuring beam irradiation unit 6 and the like. Incidentally, the random access memory (RAM) 83 has a first storage region 83a for storing the above-mentioned control map shown in FIG. 4, a second storage region 83b for storing design value data on the work (described later), a third storage region 83c for storing the height position of the semiconductor wafer 10 (described later), and other storage regions.

Figure 5:
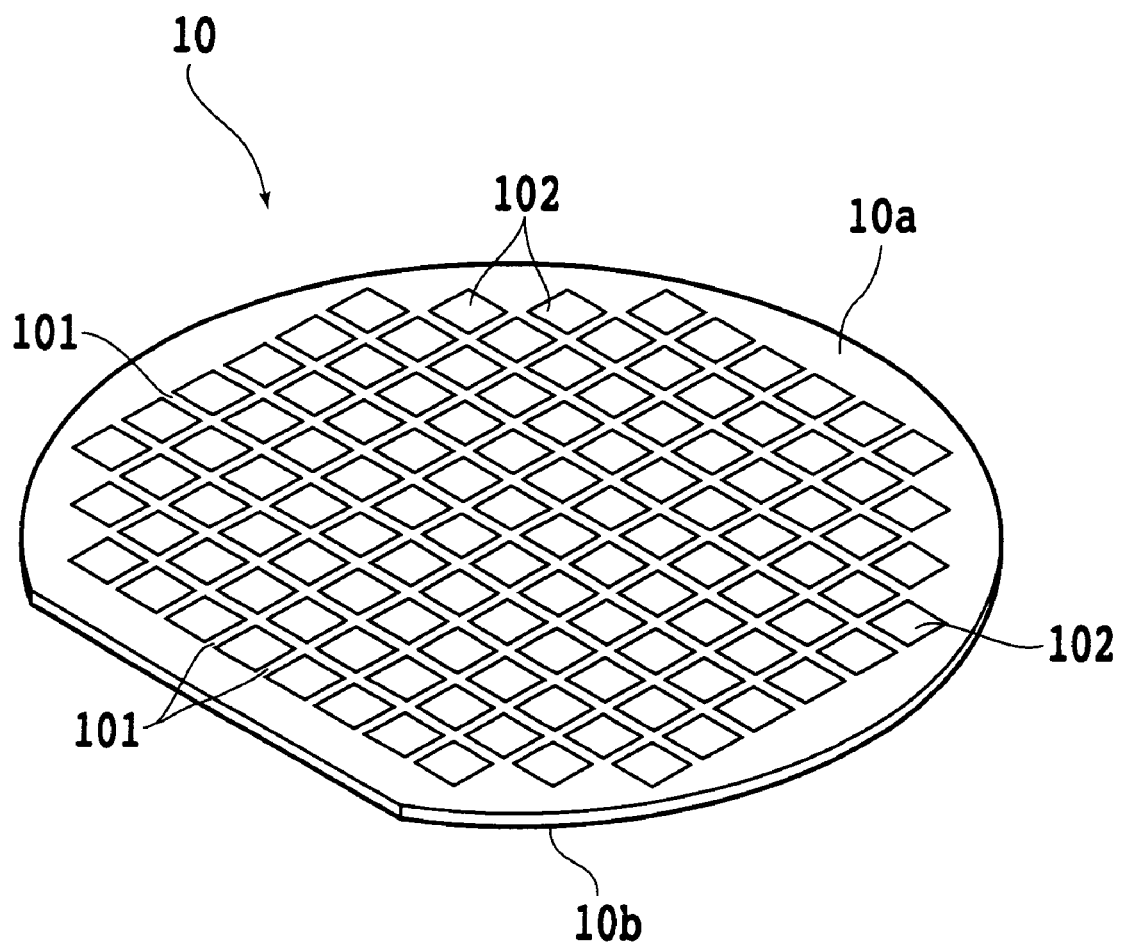
FIG. 5 is a perspective view of a semiconductor wafer as a work to be machined by the laser beam machining apparatus shown in FIG. 1.

The laser beam machining apparatus in the embodiment shown in the figures is configured as above-described, and performs operations as follows. FIG. 5 shows a perspective view of the semiconductor wafer as the work to be laser beam machined. The semiconductor wafer 10 shown in FIG. 5 is composed of a silicon wafer having a surface 10a in which a plurality of regions are demarcated by a plurality of streets 101 arranged in a lattice pattern, and devices 102 such as ICs and LSIs are formed in the thus demarcated regions. Now, an embodiment of laser beam machining in which the semiconductor wafer 10 is irradiated with a laser beam along the planned dividing lines 101 by use of the above-described laser beam machining apparatus to form a denatured layer in the inside of the semiconductor wafer 10 along the streets 101, will be described below. Incidentally, in forming the denatured layer in the inside of the semiconductor wafer 10, the presence of a dispersion of the thickness of the semiconductor wafer makes it impossible or very difficult to form the denatured layer uniformly at a predetermined depth, due to the relationship thereof with the refractive index as above-mentioned. In view of this, prior to the laser beam machining, the height position of the semiconductor wafer 10 held by the chuck table 36 is measured by the above-described measuring apparatus.

Specifically, first, the semiconductor wafer 10 is mounted, with the back side 10b up, on the chuck table 36 of the above-described laser beam machining apparatus shown in FIG. 1, and the semiconductor wafer 10 is held onto the chuck table 36 by suction. The chuck table 36 with the semiconductor wafer 10 held thereon by suction is positioned just under the image pickup means 7 by operating the machining feeding means 37. When the chuck table 36 is positioned just under the image pickup means 6, an alignment work is carried out in which a work region to be laser beam machined of the semiconductor wafer 10 is detected by the image pickup means 6 and the control means 8. More specifically, the image pickup means 7 and the control means 8 perform an alignment for detection of the height position by carrying out an image processing, such as pattern matching, for alignment between the street 101 formed in the semiconductor wafer 10 along a predetermined direction and the chromatic aberration lens 62 of the measuring beam irradiation unit 6 for detecting the height of the semiconductor wafer 10 along the street 101. In addition, the alignment for detection of the height position is similarly performed also for the street 101 which is formed in the semiconductor wafer 10 along a direction orthogonal to the predetermined direction. In this case, the face side 10a formed with the streets 101 of the semiconductor wafer 10 is located on the lower side, but the image of the street 101 can be picked up (in a transmitted manner) on the side of the back side 10b of the semiconductor wafer 10, since the image pickup means 7 includes image pickup means composed of the infrared illumination means, the optical system for catching the infrared rays, the image pickup device (infrared CCD) for outputting an electrical signal corresponding to the infrared rays thus caught, etc.

Figure 6A:
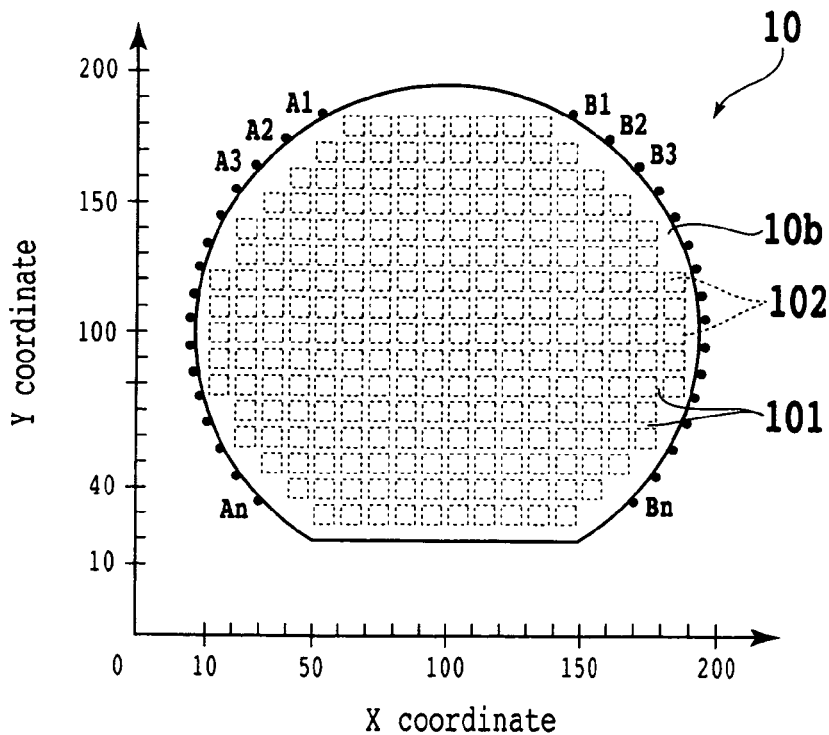
FIGS. 6A and 6B are illustrations of the relationship between the semiconductor wafer shown in FIG. 5 and the coordinate position in the condition where the semiconductor wafer is held in a predetermined position of a chuck table of the laser beam machining apparatus shown in FIG. 1.
Figure 6B:
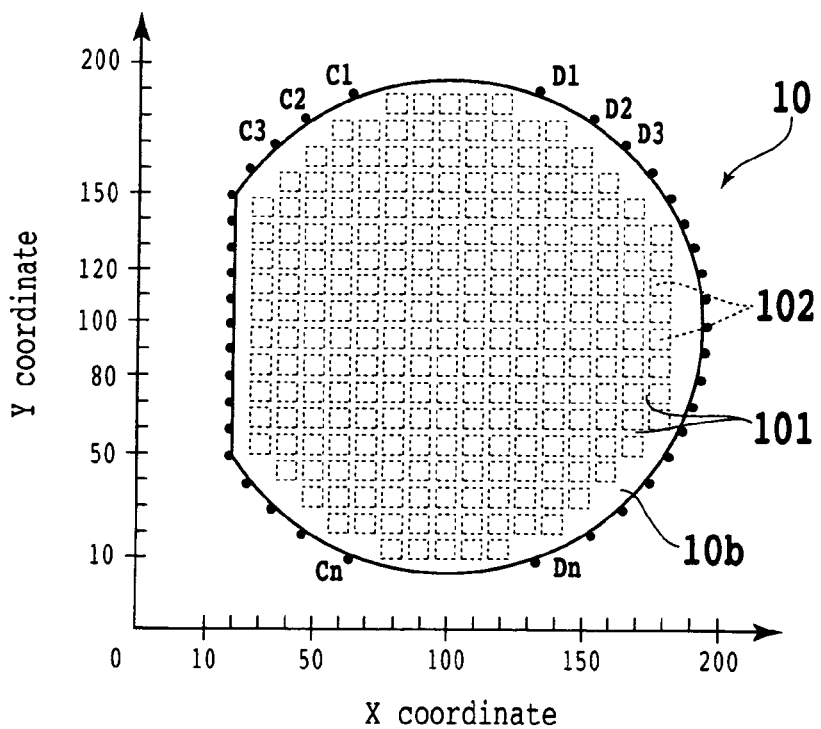

Upon the alignment conducted as above, the semiconductor wafer 10 on the chuck table 36 is in the state of positioned at the coordinate position shown in FIG. 6A. Incidentally, FIG. 6B shows the condition where the chuck table 36, hence, the semiconductor wafer 10 has been rotated by 90 degrees from the state shown in FIG. 6A. Incidentally, as for the feed starting position coordinates A1, A2, A3 . . . An, the feed finishing position coordinates B1, B2, B3 . . . Bn, the feed starting position coordinates C1, C2, C3 . . . Cn and the feed finishing position coordinates D1, D2, D3 . . . Dn of the streets 101 formed in the semiconductor wafer 10 in the state of being positioned in each of the coordinate positions shown in FIGS. 6A and 6B, the design value data are stored in the second storage region 83b of the random access memory (RAM) 8.

Figure 7:
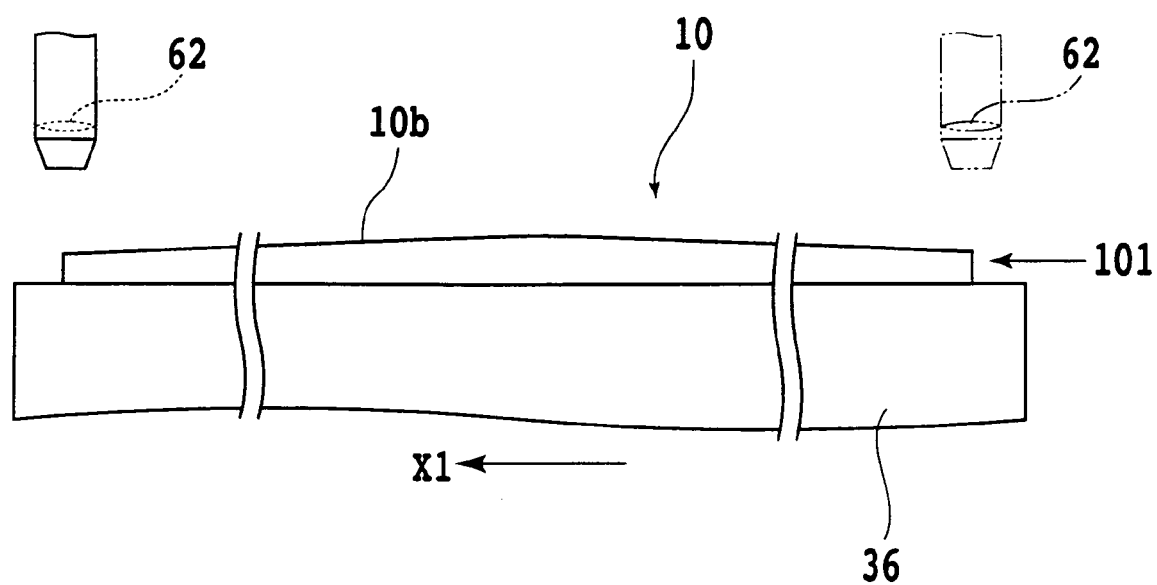
FIG. 7 is an illustration of a height position detecting step carried out by a measuring apparatus for the work held by the chuck table provided in the laser beam machining apparatus shown in FIG. 1.

After the street 101 formed in the semiconductor wafer 10 held on the chuck table 36 is detected and the alignment for detecting the height position is conducted as above-described, the chuck table 36 is moved so that the uppermost street 101 in FIG. 6A is positioned just under the chromatic aberration lens 62 of the measuring beam irradiation unit 6. Then, further, as shown in FIG. 7, the feed starting position coordinate A1 (see FIG. 6A) which is one end (the left end in FIG. 7) of the street 101 is positioned just under the chromatic aberration lens 62. Subsequently, the measuring beam irradiation unit 6 is operated, and the chuck table 36 is moved in the direction indicated by arrow X1 in FIG. 7 to the feed finishing position coordinate B1 (height position detecting step). As a result, the height position, at the uppermost street 101 in FIG. 6A, of the semiconductor wafer 10 is measured as above-mentioned. The height position thus measured is stored into the third storage region 83c of the random access memory (RAM) 8. In this manner, the height position detecting step is carried out along all the streets 101 formed in the semiconductor wafer 10, and the height positions at the streets 101 are stored into the third storage region 83c of the random access memory (RAM) 8.

Figure 8A:
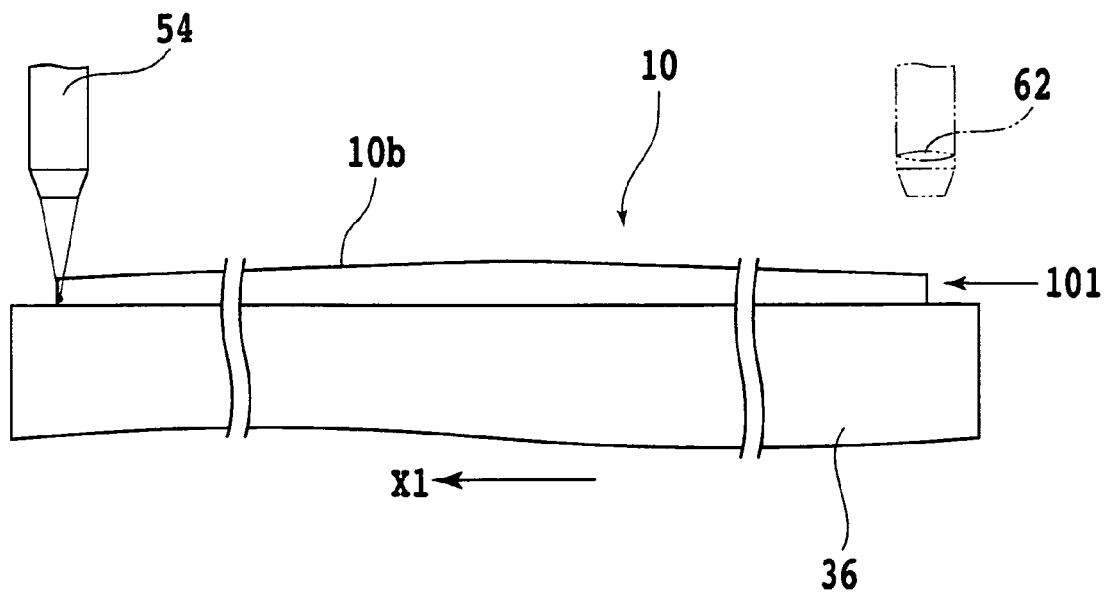
FIGS. 8A and 8B are illustrations of a machining step for forming a denatured layer in the semiconductor wafer shown in FIG. 5 by the laser beam machining apparatus shown in FIG. 1.

After the height position detecting step is carried out along all the streets 101 formed in the semiconductor wafer 10 as above, laser beam machining for forming the denatured layer in the inside of the semiconductor wafer 10 along the streets 101 is carried out. In order to carry out the laser beam machining, first, the chuck table 36 is moved so that the uppermost street 101 in FIG. 6A is positioned just under the condenser 54 of the machining feed laser beam irradiation unit 5. Then, further, as shown in FIG. 8A, the feed starting position coordinate A1 (see FIG. 6A) which is one end (the left end in FIG. 8A) of the street 101 is positioned just under the condenser 54. Subsequently, the converging point P of the pulsed laser beam radiated from the condenser 54 is adjusted to a predetermined depth position from the back side 10b (upper surface) of the semiconductor wafer 10.

Figure 8B:
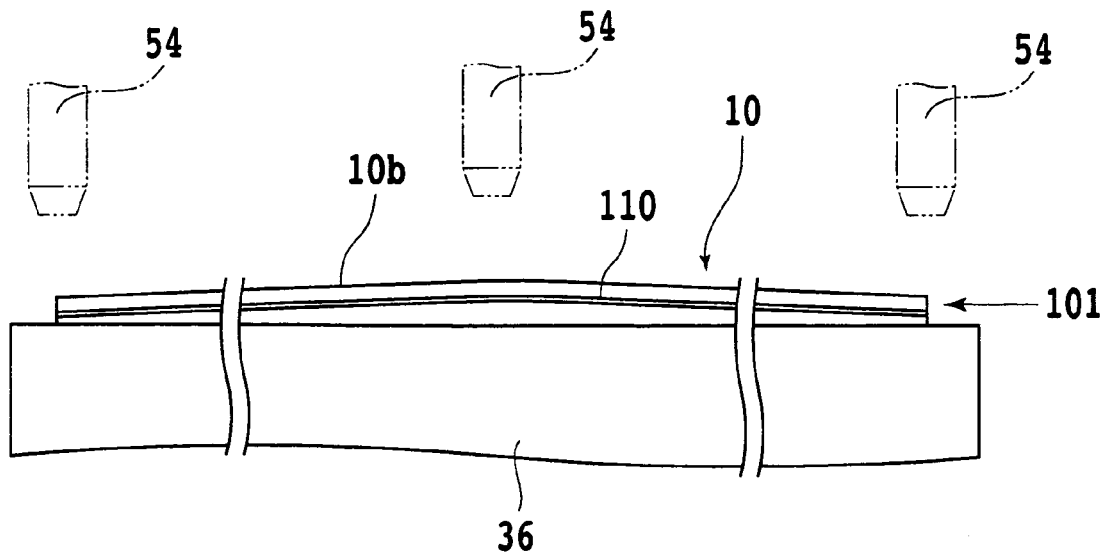

Next, the machining laser beam irradiation unit 5 is operated to move the chuck table 36 at a predetermined machining feed rate in the direction indicated by arrow Xl while radiating the pulsed laser beam from the condenser 54 (machining step). Then, when the irradiation position of the condenser 54 has reached the other end (the right end in FIG. 8B) of the street 101 as shown in FIG. 8B, the irradiation with the pulsed laser beam is stopped, and the movement of the chuck table 36 is stopped. In this machining step, the control means 8 controls the pulse motor 452 in the converging point position adjusting means 45, based on the height position at the street 101 of the semiconductor wafer 10 which is stored in the third storage region 83c of the random access memory (RAM) 83, so as to move the condenser 54 in the vertical direction correspondingly to the height position at the street 101 of the semiconductor wafer 10, as shown in FIG. 8B. As a result, a denatured layer 110 is formed in the inside of the semiconductor wafer 10 at a predetermined depth position from the back side 10b (upper surface) and in parallel to the back side 10b (upper surface), as shown in FIG. 8B.

Incidentally, the machining conditions in the machining step are set, for example, as follows.

| Laser: | YVO4 pulse laser |
|---|---|
| Wavelength: | 1064 nm |
| Repetition frequency: | 100 kHz |
| Pulse output: | 2.5 µJ |
| Condensed spot diameter: | φ 1 µm |
| Machining feed rate: | 100 mm/sec |

Figure 9:
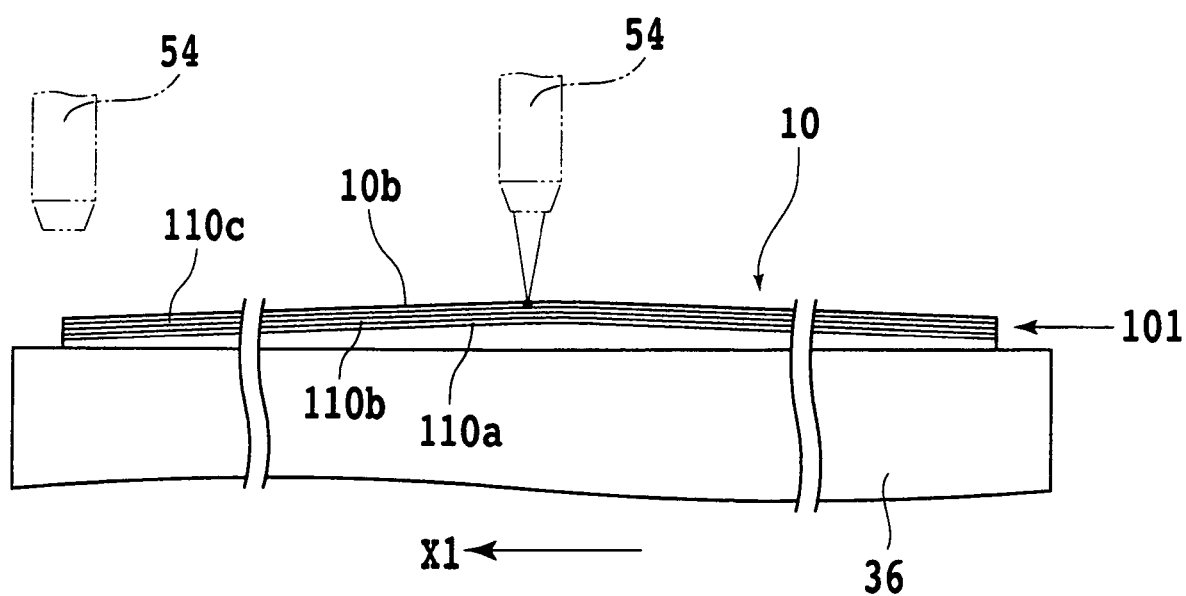
FIG. 9 is an illustration of the machining step in the case where the work has a large thickness.

Incidentally, in the case where the semiconductor wafer 20 is large in thickness, it is desirable to carry out the above-mentioned laser beam irradiation step a plurality of times while changing the converging point P stepwise, to form a plurality of denatured layers 110a, 110b, 110c, as shown in FIG. 9. The formation of the denatured layers 110a, 110b and 110c is preferably carried out by displacing the converging point of the laser beam stepwise in the order of 110a, 110b and 110c. After the machining step is carried out along all the streets 101 extending in a predetermined direction of the semiconductor wafer 10 as above, the chuck table 36 is turned by 90 degrees, and the machining step is carried out along each of the streets 101 extending orthogonally to the predetermined direction. After the machining step is carried out along all the streets 101 formed in the semiconductor wafer 10 in this manner, the chuck table 36 with the semiconductor wafer 10 held thereon is returned to the position where the semiconductor wafer 10 has initially been held by suction, and the holding of the semiconductor wafer 10 by suction is released in this position. Then, the semiconductor wafer 10 is fed to a dividing step by conveying means (not shown).

Figure 10:
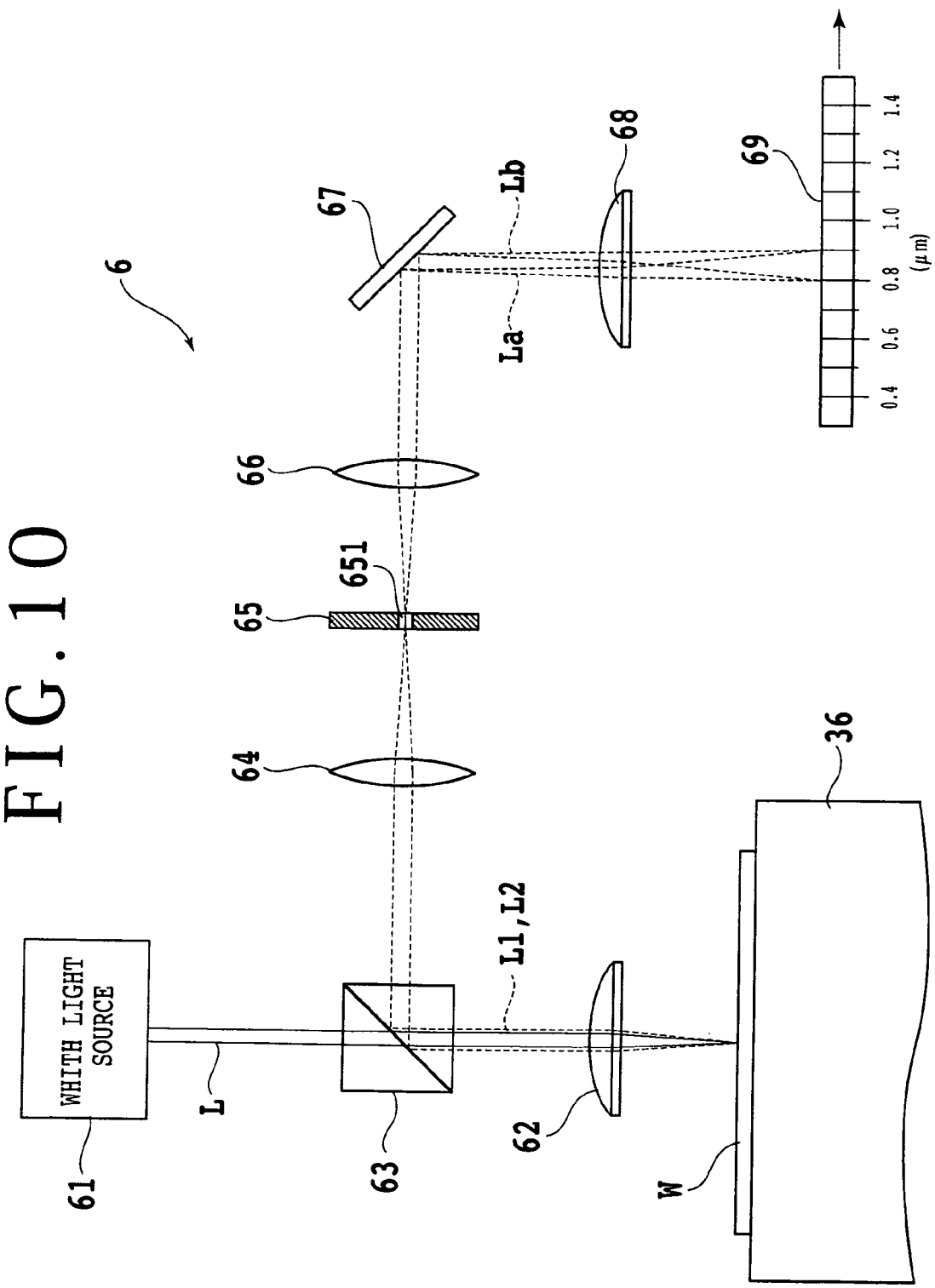
FIG. 10 is an illustration of measurement of the thickness of the work held by the chuck table provided in the laser beam machining apparatus shown in FIG. 1, the measurement being carried out by the measuring apparatus for the work.

Now, an example of measurement of the thickness of the work by the above-described measuring apparatus will be described below, referring to FIG. 10. As indicated by solid lines in FIG. 10, the white beam L emitted from the white light source 61 is transmitted through the beam splitter 63 to enter the chromatic aberration lens 62, is condensed by the chromatic aberration lens 62, and is cast on the work W held by the chuck table 36. In this case, of the white beam condensed by the chromatic aberration lens 62, the beam portion with such a wavelength S1 as to have the converging point just on the upper surface of the work W is reflected as above-mentioned, while of the beam transmitted through the work W, the beam component with such a wavelength S2 as to have the converging point just at the lower surface of the work W is reflected as indicated by broken lines in FIG. 10. The reflected beams L1, L2 thus reflected respectively at the upper surface and the lower surface of the work W are reflected by the beam splitter 63 as indicated by broken lines as above-mentioned, and then pass through the first condenser lens 64, the pinhole 651 in the mask 65 and the second condenser lens 66, to reach the diffraction grating 67.

The reflected beams L1, L2 having reached the diffraction grating 67 are converted into diffracted beams La, Lb corresponding respectively to the wavelength S1 and the wavelength S2, and are reflected at angles corresponding respectively to the wavelengths, to reach the third condenser lens 68. The diffracted beams corresponding to the wavelength S1 and the wavelength S2 which have reached the third condenser lens 68 are condensed respectively, to be incident on the wavelength detecting means 69. For example, in the case where the diffracted beam La with the wavelength S1 is radiated to a position of 0.8 µm of the wavelength detecting means 69 and the diffracted beam Lb with the wavelength S2 is radiated to a position of 0.9 µm of the wavelength detecting means 69, the control means 8 collates the wavelengths based on the wavelength signal from the wavelength detecting means 69 with the control map shown in FIG. 4, to find that the focal distance relevant to the wavelength S1 is 29.4 mm and the focal distance relevant to the wavelength S2 is 29.6 mm. Therefore, by computing the difference between the focal distances (29.6 mm-29.4 mm), the control means 8 determines the thickness of the work W to be 0.2 mm (200 µm).

By measuring the thickness of the work in this manner, it is possible, for example in the case of providing a semiconductor wafer with a hole (via hole) reaching a bonding pad by use of a pulsed laser beam, to set the number of pulses correspondingly to the thickness of the work and, therefore, to accurately form the hole (via hole) reaching the bonding pad.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An apparatus for measuring the height of a work held by a chuck table provided in a machining apparatus, comprising:
   a white light source for emitting a white beam;
   a chromatic aberration lens for condensing the white beam emitted from said white light source so as to irradiate said work held by said chuck table with said condensed white beam;
   a beam splitter which is disposed between said white light source and said chromatic aberration lens and by which the reflected beam of said white beam irradiating said work therewith is split;
   a first condenser lens for condensing the reflected beam which is again reflected by said beam splitter;
   a mask provided with a pinhole which is disposed at a converging point position of said first condenser lens and through which the reflected beam condensed by said first condenser lens passes;
   a second condenser lens for condensing the reflected beam having passed through said pinhole in said mask;
   a diffraction grating by which the reflected beam condensed by said second condenser lens is converted into a diffracted beam;
   a third condenser lens for condensing the diffracted beam diffracted by said diffraction grating;
   wavelength detecting means for detecting the wavelength of the diffracted beam condensed by said third condenser lens; and
   control means for determining the height position of said work held by said chuck table, based on a wavelength signal from said wavelength detecting means;
   wherein said control means has a memory for storing a control map setting the relationship between wavelengths and focal distances for the white beam condensed by said chromatic aberration lens, and collates the wavelength signal from said wavelength detecting means with said control map so as to determine the focal distance from said chromatic aberration lens, thereby measuring the height position of said work held by said chuck table.

2. The measuring apparatus for the work held by the chuck table as set forth in claim 1, further comprising:
   X-axis moving means for relatively moving said chromatic aberration lens and said chuck table in an X-axis direction;
   Y-axis moving means for relatively moving said chromatic aberration lens and said chuck table in a Y-axis direction orthogonal to said X-axis direction;
   X-axis direction position detecting means for said chuck table; and
   Y-axis direction position detecting means for said chuck table;
   wherein said control means determines the height position, at a predetermined position, of said work, based on detection signals from said wavelength detecting means as well as said X-axis direction position detecting means and said Y-axis direction position detecting means, and has a memory for storing the height position, at said predetermined position, of said work.

3. A laser beam machining apparatus including a chuck table having a holding surface for holding a work thereon, machining laser beam irradiation means for irradiating said work held by said chuck table with a machining laser beam, and converging point position adjusting means for moving said machining laser beam irradiation means in a direction orthogonal to said holding surface of said chuck table,
   wherein a measuring apparatus as set forth in claim 1 is provided, and said measuring apparatus measures the height position of said work held by said chuck table.

* * * * *